United States Patent [19]

Harvey et al.

[11] Patent Number: 4,968,900
[45] Date of Patent: Nov. 6, 1990

[54] PROGRAMMABLE SPEED/POWER ARRANGEMENT FOR INTEGRATED DEVICES HAVING LOGIC MATRICES

[75] Inventors: Ian E. Harvey, El Toro, Calif.; Christopher W. Malinowski, Melbourne Beach, Fla.

[73] Assignee: Harris Corporation, Melbourne, Fla.

[21] Appl. No.: 387,534

[22] Filed: Jul. 31, 1989

[51] Int. Cl.$^5$ ............................................ H03K 19/00
[52] U.S. Cl. ................................ 307/296.3; 307/465; 307/202.1; 365/227
[58] Field of Search ...................... 307/443, 202.1, 465, 307/468, 469, 296.3; 340/825.83, 825.85; 364/707, 716, 273.1, 273.2; 365/227

[56] References Cited

U.S. PATENT DOCUMENTS

| | | | |
|---|---|---|---|
| 4,381,552 | 4/1983 | Nocilini et al. | 364/900 MS |
| 4,384,220 | 5/1983 | Segawa et al. | 365/227 X |
| 4,631,418 | 12/1986 | Toyomura | 307/296.3 |
| 4,686,386 | 8/1987 | Tadao | 365/227 X |
| 4,691,123 | 9/1987 | Hashimoto | 307/296.3 |
| 4,713,560 | 12/1987 | Hernden | 307/296.7 X |
| 4,801,820 | 1/1989 | Nootbaar | 307/465 X |

OTHER PUBLICATIONS

Flaker et al., "Programmed Power Proportioning for PLA's", *IBM T.D.B.*, vol. 18, No. 4, Sep. 1975, pp. 1047–1048.

*Primary Examiner*—David Hudspeth
*Attorney, Agent, or Firm*—Barnes & Thornburg

[57] ABSTRACT

A programmable speed/logic arrangement for integrated devices having logic matrices which permits a user to determine the method by which the a logic matrix of an integrated circuit is switched between a low power standby and a high power operation mode. The arrangement includes a switching circuit for switching the logic matrix between modes, switch operating circuit responsive to at least one of internal and external wake-up pulses for operating the switching circuit, and an internal pulse generator for selectively generating a wake-up pulse internally of the matrix. The logic matrix is provided with a specific addressable location which is responsive to an appropriate address to generate the internal wake-up pulse as well as a dedicated input responsive to an externally generated wake-up pulse. Further, high/low power fuses or E/EE CMOS devices can be employed to programmably connect the logic matrix to different levels of high power sources. The plural power sources may be a plurality of parallel switches for each column.

16 Claims, 4 Drawing Sheets

PROGRAMMABLE SPEED/POWER ARRANGEMENT FOR INTEGRATED DEVICES HAVING LOGIC MATRICES

BACKGROUND AND SUMMARY OF THE INVENTION

The present invention generally relates to integrated devices having logic matrices, and more particularly, to a programmable arrangement for selectively switching a logic matrix between a low power, stand-by state, and a high power, full-speed mode in response to a wake-up pulse which is generated in different manners as selected by the user.

Typically, most integrated logic circuits employed large matrices of identical elements, such as PROMs, programmable logic arrays, RAMs and the like, which exhibit an almost constant speed-power product for a given process. Consequently, such circuits, when operating at high speeds, also consume considerable amounts of power whereas circuits designated for low power operation are significantly slower. An example of such a speed-power dependency is diagrammatically illustrated in FIG. 1 for programmable array logic circuits (PAL).

The low or zero power circuits satisfy a market segment where low average operating current must be kept to a minimum, such as for example, battery operated devices. High power circuits address that segment of the market in which the minimum required speed performance of the circuit takes precedence over the power consumption. However, in both instances, and particularly in the case of CMOS circuits, the current consumption of the circuits, when operated at full speed, is essentially the same for a given process.

Low power circuits with internal matrices are known which maintain their low, stand-by currents by turning on the power to the matrix only when signal activity is detected at the input to the matrix. This approach requires application of special circuits, such as for example, edge detectors or edge catchers, which monitor the inputs to the circuit and generate a matrix power-up pulse whenever any of the inputs change state. Since such an activity consumes significant amounts of time, the overall latency of such a circuit also increases. Conversely, high-speed circuits attain their speed advantage by keeping the matrices powered at all times, and therefore eliminate the delay associated with edge detection and the generation of a matrix power-up pulse. However, such arrangements result in high power consumption which, in some applications, is detrimental.

Additionally, power-up arrangements for logic matrices are known which permit the user to turn-on the power to the matrix as desired. Such arrangements however, do not permit the use to select the mode by which the logic matrix is powered-up. Thus, if a dedicated input is needed to generate the wake-up pulse and the logic matrix is constructed such that a power-up state is selected by a specific address or product term, the logic matrix would necessarily need to be replaced which is costly both in time and materials.

Accordingly, it is an object of the present invention to provide an arrangement for integrated devices having logic matrices which can be programmed by a user to operate in a number of different modes to switch between a high power, full-speed operational state, and a low-power, stand-by state in dependence upon different processing requirements.

It is another object of the present invention to provide an arrangement wherein the switching between the high power and low power modes is determined by the user without the need for edge detectors and the resulting delay in the power-up of the matrix.

It is yet another object of the present invention to provide an arrangement for selectively switching a logic matrix between a low power, stand-by state and a high power, full speed state, wherein the arrangement is programmable to operate in response to at least a specific address or product term as well as to a wake-up pulse applied to a dedicated input of the matrix.

The present invention can be advantageously applied where components of a digital system operate at full speed for short periods of time in dependence upon different processing requirements, spending the remaining time in an idle state.

Thus, in accordance with the teachings of the present invention, there is provided a programmable speed/power arrangement for an integrated device having a logic matrix comprising a switching arrangement for switching the logic matrix between a low power, stand-by mode, and a high power, full speed operation mode. Also included is a switch operating circuit responsive to at least one of a internally generated wake-up pulse and an externally generated wake-up pulse for operating the switching arrangement so that the logic matrix is switched between the low power and high power modes. Also included is an internal wake-up pulse generating circuit for generating a wake-up pulse in dependence upon different processing requirements. A programmable power level select circuit provides the ability so select different discrete levels of power in the high power mode.

According to certain preferred embodiments of the present invention, a selected combination of input signals, such as a dedicated product term or address, can be employed to generate the wake-up pulse internally of the logic matrix. Additionally, the matrix is provided with a dedicated input responsive to an externally generated wake-up pulse. Alternatively, the selection of the power mode of the logic circuit can be facilitated by a fused link or E/EE-programmable cell which permits the operation of the logic matrix in a selected mode either permanently, i.e. fuse link, or quasi permanently, i.e. E/EE CMOS process.

Other objects, advantages and novel features of the present invention will become apparent from the following detailed description of the invention when considered in conjunction with the accompanying drawings.

DETAILED DESCRIPTION OF THE DRAWINGS

Figure 2:
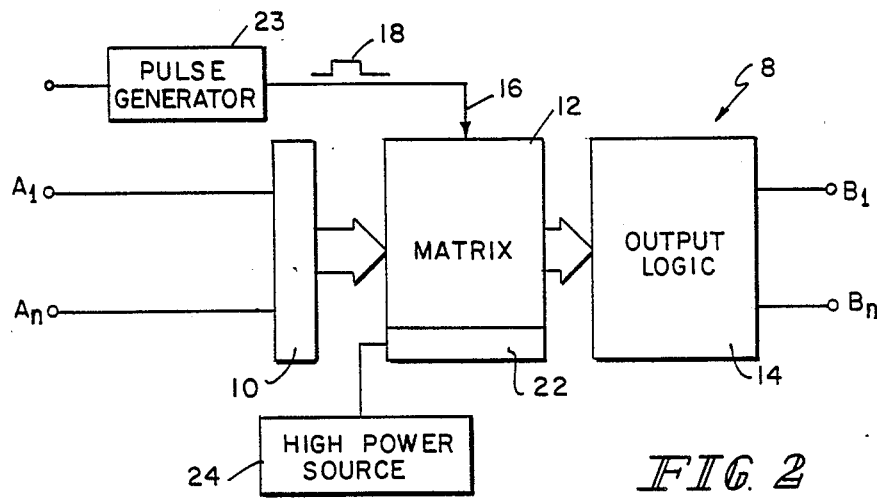
FIG. 2 illustrates one embodiment of the present invention wherein the logic matrix is provided with a dedicated wake-up input.

Referring to FIG. 2, a logic matrix, generally indicated at 8, is illustrated comprising a plurality of input terminals A1–An connected to input logic or decoder 10 of a matrix 12 having output logic or decoder 14 connected to a plurality of output terminals B1–Bn. In accordance with the teachings of the present invention, the matrix 12 is provided with a dedicated input 16 responsive to an externally generated wake-up pulse 18 provided by a pulse generator 23 to operate a switching circuit 22 and connect the logic matrix 8 to a high power source 24 without the use of an edge detector.

Figure 3:
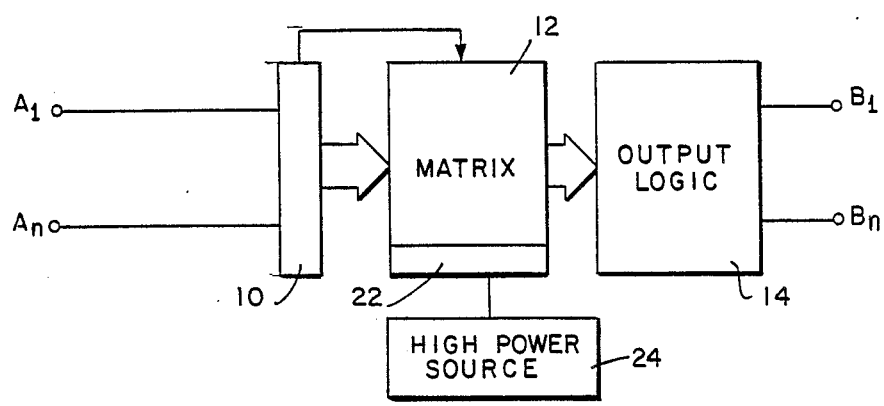
FIG. 3 illustrates another embodiment of the present invention wherein the power mode of the logic matrix is switched by means of a dedicated product term or address.

In accordance with another mode of operation of the present invention, as illustrated in FIG. 3, a dedicated product term or address can be applied to the input logic 10 so that a subsequent wake-up pulse is internally generated by the matrix 12.

Figure 5:
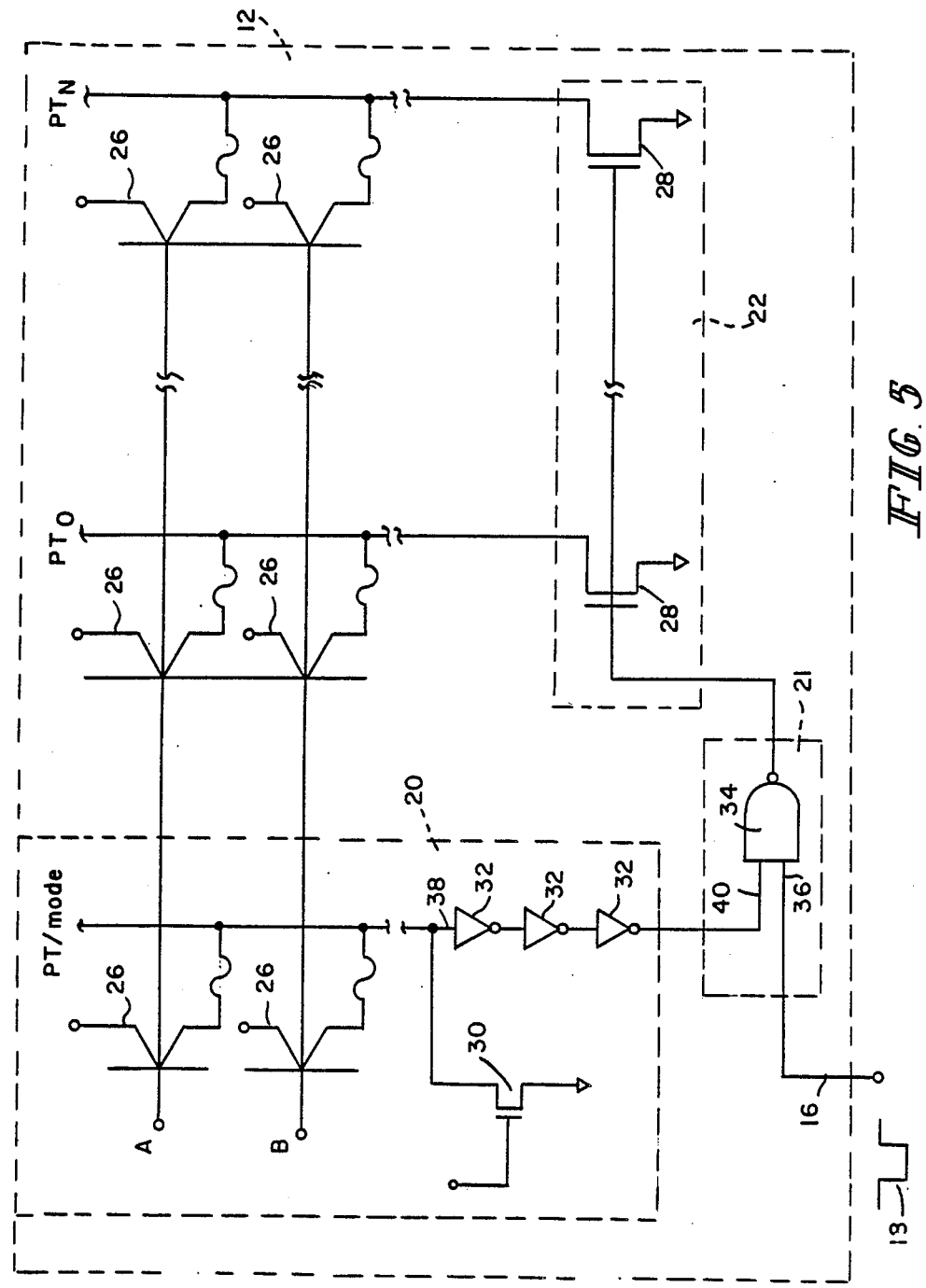
FIG. 5 schematically illustrates a circuit arrangement for selecting the power mode of a logic matrix by applying an external wake-up pulse to a dedicated input, as well as by internal generation.

FIG. 5 illustrates a circuit arrangement for operating the logic matrix 8 in accordance with the embodiments illustrated in FIGS. 2 and 3. As shown in FIG. 5, the matrix 12 comprises a plurality of semiconductor devices 26 arranged in a plurality of columns and rows; however, it should be appreciated that the logic matrix 12 may comprise other suitable devices such as, for example, ferrite corroidal rings, thin film devices and direct-coupled transistor flip-flops and the like. The matrix 12 further includes a switching circuit 22 comprising a plurality of switches 28 such as, for example, field effect transistors. Each column or row of the matrix is provided with a switch 28, connecting a respective column or row to the power source and being operable in unison. In the embodiment shown in FIG. 5, the switches comprise n-channel field effect transistors (FETs) each having its source-drain path connecting the column to ground and its gate connected to switch operating circuit 21. Since the n-channel FETs are non-conducting unless a high signal is applied to the gate, no current or little current can pass through the matrix 12 unless the FETs are turned on.

Operation of the switching circuit 22 is facilitated by a dedicated input 16 for receiving an externally generated wake-up pulse and by operation of an internal wake-up pulse generator 20. In the embodiment illustrated in FIG. 5, the wake-up pulse generator 20 comprises specific addressable locations A,B connected to an n-channel, pull-down field effect transistor 30 having its source-drain path connected between ground and the input 38 of a series of inverters 32 having an output connected to a switch operating circuit 21 by an input 40 of a NAND gate 34. Also connected to the input 38 of the inverters 32 are transistors 26 of addressable location A,B of matrix 12. Although only two rows are illustrated, each row of the matrix would include a transistor 26. A high on any input A or B will activate its transistor 26 and place on a high at 38. A fuse is provided in the collector-emitter path of transistors 26 and may be individually programmed so that a specific address verses any address will produce power-up or wake-up. Another input 36 of the NAND gate 34 is connected to a dedicated input 16 of the matrix 12, the dedicated input 16 being connected to the switches 28 of the switching circuit 22 through the switch operating circuit 21 so as to close the switches 28 in unison upon the application of a low signal, such as a wake-up pulse 18 to input 36 as will be further described hereafter.

In operation, anything other than 1,1 at the input of the NAND gate 34 will turn on the matrix 12. Thus, in a stand-by state, the FET 30 is turned on so that current flows to ground and the input 38 to the first inverter 32 is zero. As a result, the input to the NAND gate 34 from the inverters 32 is 1. Concurrently, a high signal is provided to the other input 36 of the NAND gate 34 so that the output of the NAND gate 34 is zero and the switches 28 remain open.

In order to power-up the matrix 12, the n-channel FET 30 remains on so that the input 38 to the inverters 32 is zero resulting in an output of 1 to the first input 40 of the NAND gate 34. Concurrently, an externally generated wake-up pulse 18 is generated by driving the high signal provided to the other input 36 down to provide a zero input at input 36 of the NAND gate 34, which would result in a high output of the NAND gate 34, thus closing the switching circuit 28 and permitting the matrix 12 to power-up.

Alternatively, the arrangement can be operated to power-up the the matrix 12 using an internally generated wake-up pulse, As shown, the matrix 12 is provided with at least one specific addressable location A,B connected to the input 38 of the series of inverters 32. As previously described, anything other than 1,1 at the inputs 36, 40 of the NAND gate 34 will close the switches 28 of the switching circuit 22 and permit current to flow through the matrix 12. Assuming that a high signal is provided to the input 36 of the NAND gate 34, when the at least one specific addressable location A,B is not addressed, the input 38 to the series of inverters 32 will be zero due to the operation of the pull-down transistor 30 resulting in a high signal at the input 40 of the NAND gate 34 so that the switches 28 of the switching arrangement 22 remain open and no current or little current flows through the matrix 28 from the power source (not shown) which is connected in a similar manner as shown in FIG. 5. However, when the input logic 10 receives the appropriate dedicated product term or address, the at least one specific addressable location A,B is turned on permitting the flow of current so as to provide a high signal to the input 38 of the series of inverters 32. The transistor 30 now operates as a voltage divider resulting in the signal at the input 40 of NAND gate 34 going low. Thus, a high signal is provided by the NAND gate 34 to the gates of the FETs which comprise the switches 28 so that the FETs now conduct and permit current flow from the power source (not shown) to flow through the matrix 12 and to ground.

It should be noted with regard to both modes of operation described above in reference to FIG. 5 that a flip-flop circuit can be provided at the inputs 36 and 40 of the NAND gate 34 so that it is not necessary to consistently apply a high signal to this input. An appropriate reset arrangement for the flip-flop is provided so as to change the signal to the inputs 36 and 40 from high to low as illustrated for input 40 in FIG. 7.

Figure 1:
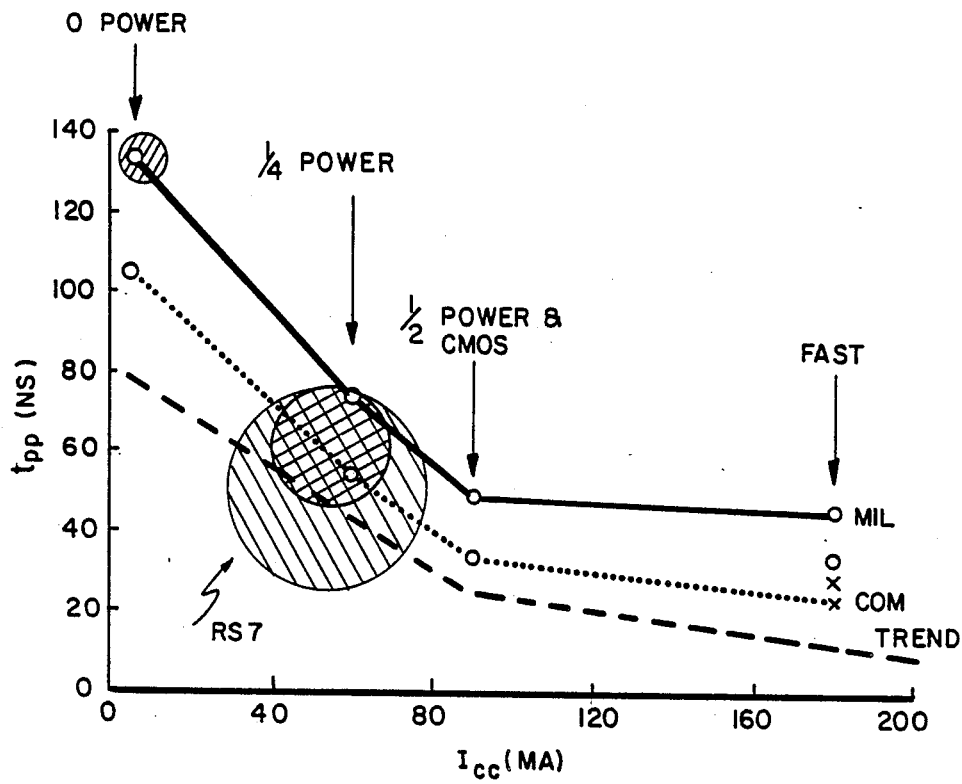
FIG. 1 diagrammatically illustrates the relationship between the speed of operation of a circuit as compared to the power consumption.
Figure 6:
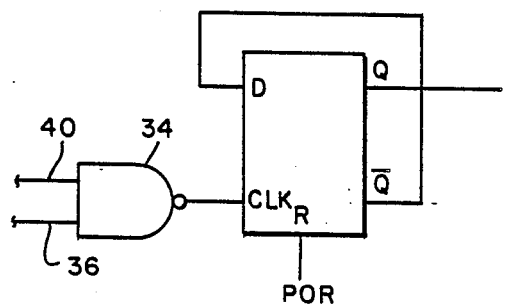
FIG. 6 schematically illustrates switch operating circuit with a flip-flop.

Alternatively, a flip-flop circuit could be provided to the output of NAND gate 34 as illustrated in FIG. 6. The clock input of the flip-flop 46 is connected to the output of NAND gate 34. The data input of the flip-flop is connected to the $\overline{Q}$ output and the $\overline{Q}$ output is connected to the switching circuit 32. The reset R of the flip-flop 46 receives a reset signal from POR. In its initial state after reset, the $\overline{Q}$ output is high and the $\overline{Q}$ output is low. Upon a clock transition of the NAND gate 34 from a low to a high, the one from the $\overline{Q}$ output at the data input D is transferred to the $\overline{Q}$ output turning on switches 28. The transition of the output of NAND gate 34 from a high to low does not effect the flip-flop 46. The flip-flop is not reset until it receives the POR reset signal.

Figure 4:
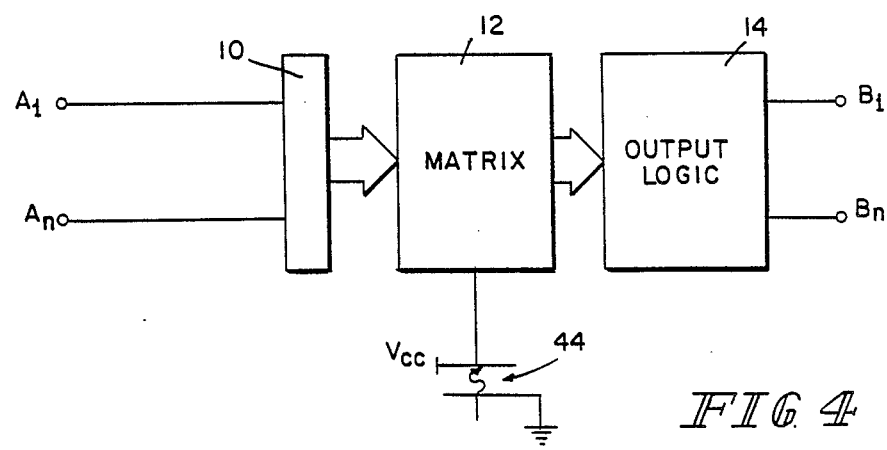
FIG. 4 illustrates yet another embodiment of the present invention wherein the power mode of the logic matrix is selected by a fuse link or E/EE programmable cell.

According to yet another embodiment of the present invention, as illustrated in FIG. 4, a matrix 12 is provided with high-low power fuses at 44. These high-low power fuses may comprise either a permanent fuse link as illustrated or a quasi-permanent arrangement, such as for example E/EE CMOS devices. Thus, by selecting the appropriate fusing arrangement, the power source VCC or ground is connected to the matrix 12 to define first and second levels or magnitudes of high power.

Figure 7:
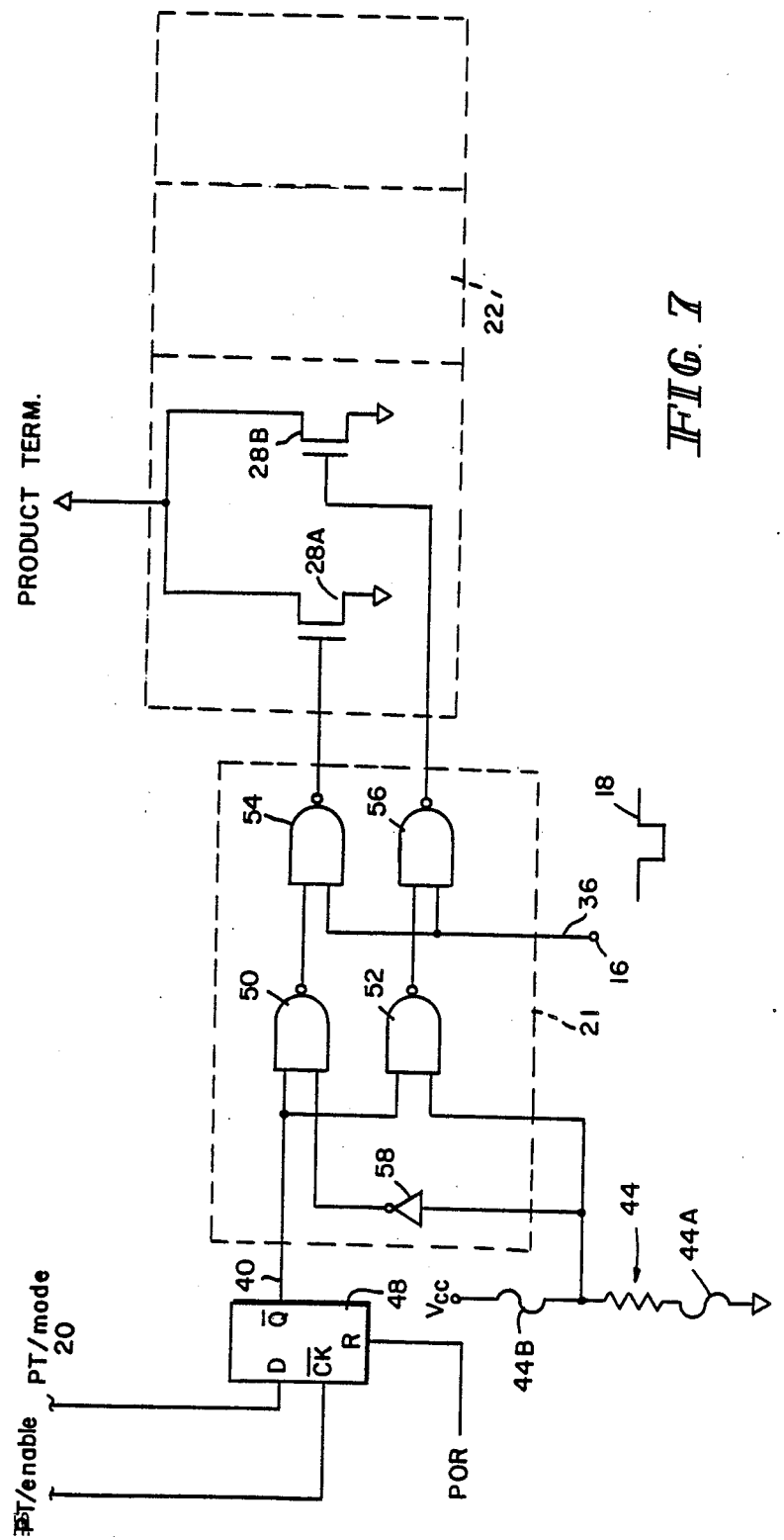
FIG. 7 schematically illustrates a programmable power level select circuit for the high power mode.

In addition to selecting when to be in a high power mode, the present system may also provide the ability to select between different levels of high power. In the circuit of FIG. 7, the selection is between one-third, two-thirds and full high power. The fuse selection 44 from FIG. 4 selects between providing ground through a resistor or VCC as an input to the switch operating circuit 21. The switching circuit 22 includes two switch transistors 28A and 28B of different size such that 28A will carry half the current of 28B. Thus a selection of the appropriate transistor will provide a one-third, two-thirds or full power on. As will be explained more fully with respect to the switch operating circuit 21, with all the fuses intact and VCC provided to the switching circuit 21, two-thirds or is provided for an internally generated wake-up. Blowing fuse 44 will also provide the same result. If one-third of the fully power is required for an internally generated wake-up, fuse 44V is blown providing a grounded input through the resistor to the switch operating circuit 21.

The switch operating circuit 21 includes, instead of a NAND gate 34, four NAND gates 50, 52, 54 and 56. The output of power level select circuit 44 is provided directly as an input NAND gate 52 and through inverter 58 to NAND gate 50. The other inputs to NAND gates 50 and 52 is from the internal wake-up pulse generator 20 through flip-flop 48. The output of NAND gates 50 and 52 are provided to NAND gates 54 and 56 respectfully. The other input to NAND gates 54 and 56 are from the external wake-up pulse generator 18. The output of NAND gate 54 controls transistor 28A and the output of NAND gate 56 controls switch transistor 28B. The signal from the internal wake-up pulse generator 20 is provided to the data of input of flip-flop 48 and the $\overline{Q}$ output is provided to the NAND 50 and 52. A signal POR is provided to the reset terminal R and the clock terminal is connected to a product term enables signal PT/ENABLE.

The operation of the circuit of FIG. 7 is as follows. When the output from the internal wake-up pulse generator 20 is high, indicating non-addressing and therefore should be in the zero power mode, the $\overline{Q}$ output is zero. This forces the NAND gates 50 and 52 to provide a one at their outputs irrespective of the input from the power level control circuit 44. The one at the input of NAND gates 54 and 56 enables them to be controlled by the level of the external wake-up signal 18. If 18 is high, the output of NAND gates 54 and 56 are low and both transistors 28A and 28B are off. If the external wake-up signal 18 goes low, the output of both the NAND gates 54 and 56 will be high and therefore turning 28A and 28B on providing a full power level.

If the internal wake-up pulse generator 20 provides a low signal, the $\overline{Q}$ output of flip-flop 48 will be a one enabling NAND gates 50 and 52 to produce a zero and one depending upon the power level selected by the power level selector circuit 44. If fuse 44B is intact, a high input signal on NAND 52 and a low input signal on NAND gate 50 will produce a low out of NAND gate 52 and a high out of NAND gate 50. If the external wake-up signal 18 is a high, the output of NAND gate 56 will be a high turning on transistor 28B and the output of NAND gate 54 will be a low turning on transistor 28B. This will provide two-thirds of the power level. If fuse 48B is opened to provide a low signal to NAND gate 52 and high signal NAND gate 50, the output of NAND gate 50 will be a low and the output of NAND gate 52 will be a high. Thus the output of NAND gate 54 will be a high and the output of NAND gate 56 will be a low turning off transistor 28A and turning on transistor 28B. This will provide two-thirds the power level.

It should be noted that the programmable power level circuit 44 may select a power level for not only the internal but the external wake-up signal. To achieve this, the NAND gates 54 and 56 will be deleted and the NAND gates 50 and 52 would be connected directly to transistors 28A and 28B respectfully. The common input to the NAND gates 50 and 52 would be from the NAND gate 34 from FIG. 5. Thus depending upon the power up or power down signal from NAND gate 34 into NAND gates 50 and 52, the selection of one or the other transistors 28A and 28B will be determined by the power lever select circuit 44 to provide on half or full power. Also it should be noted that if more than three levels are required for FIG. 7 or more than two levels with the modification using the NAND gate 34 of FIG. 5, additional transistors and logic can be provided.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A programmable speed/power arrangement for an integrated device having a logic matrix comprising:
   (a) switching means for switching the logic matrix between a low power, stand-by mode and a high power, high speed operation mode;
   (b) switch operating means responsive to at least one of a wake-up pulse generated externally of the logic of the matrix and a wake-up pulse generated internally of the logic matrix for operating the switching means; and
   (c) internal wake-up pulse generator means, connected to the switch operating means, for selectively generating an internal wake-up pulse in dependence upon processing requirements.

2. An arrangement according to claim 1, wherein the switch operating means and the switching means are part of the logic matrix.

3. An arrangement according to claim 1, wherein the switch operating means comprises a NAND gate having a first and second input and an output connected to the switching means, said first input being connected to the internal wake-up Pulse generator means for receiving a high signal at the one input of the NAND gate when the internally generated wake-up pulse is absent and a low signal at the first input of the NAND gate upon internal generation of the wake-up pulse, and said second input of the NAND gate being coupled to receive the externally generated wake-up pulse.

4. An arrangement according to claim 3, wherein the switching means is operated in dependence upon the output state of the output of the NAND gate, the switching means being connected between the logic matrix and a power source.

5. An arrangement according to claim 4, wherein the switching means comprises a plurality of parallel switches operated in unison.

6. An arrangement according to claim 5, wherein the plurality of switches prevent current flow from the power source through the matrix to ground when the plurality of switches are open and further permit flow from the power source through the matrix to ground when the switches are closed.

7. An arrangement according to claim 1, wherein the internal wake-up pulse generator means comprises:
a plurality of specific addressable locations in the logic matrix, one of the specific addressable locations being responsive to an appropriate address to generate the wake-up pulse to operate the switching means.

8. An arrangement according to claim 7, wherein the pulse generator means comprises a NAND gate having first and second input and an output connected to the switching means, said first input being connected to one of the specific addressable locations which generates a low signal when the one specific addressable location is addressed and a high signal when the one specific addressable location is not addressed and said second input of the NAND gate being coupled to receive the externally generated wake-up signal.

9. An arrangement according to claim 8, wherein the switching means is operated in dependence upon the output state of the output of the NAND gate, the switching means being connected between the logic matrix and a power source.

10. An arrangement according to claim 9, wherein the switching means comprises a plurality of parallel switches operated in unison.

11. An arrangement according to claim 10, wherein the plurality of switches prevent current flow from the power source through the matrix to ground when the plurality of switches are open and further permit flow from the Power source through the matrix to ground when the switches are closed.

12. An arrangement according to claim 1, wherein said switch operating means include programmable power means for programmably determining the magnitude of said high power of said operation mode.

13. An arrangement according to claim 12, wherein the programmable power means includes a high-low fuse for selectively connecting the logic matrix to a first or second magnitude power sources.

14. An arrangement according to claim 12, wherein the programmable power means includes E/EE CMOS devices connecting the logic matrix to a first and second magnitude power sources.

15. An arrangement according to claim 12, wherein said switching means includes a plurality of parallel switching means for each column of said logic matrix, and said programmable power means determines which parallel switching means per column are closed in said operation mode to determine the magnitude of high power by said switch operating means.

16. An arrangement according to claim 15, wherein said switch operating means closes a different combination of switching means for internally and externally generated wake-up pulse to determine different magnitude of high power by said switch operating means.

* * * * *